(12) United States Patent
Chino

(10) Patent No.: US 8,293,576 B2
(45) Date of Patent: Oct. 23, 2012

(54) SEMICONDUCTOR DEVICE AND METHOD OF MANUFACTURING THE SAME

(75) Inventor: Teruaki Chino, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 65 days.

(21) Appl. No.: 12/897,085

(22) Filed: Oct. 4, 2010

(65) Prior Publication Data

US 2011/0079913 A1 Apr. 7, 2011

(30) Foreign Application Priority Data

Oct. 6, 2009 (JP) ................................ 2009-232163

(51) Int. Cl.
*H01L 21/00* (2006.01)

(52) U.S. Cl. . 438/108; 438/112; 438/113; 257/E21.502; 257/E23.116

(58) Field of Classification Search .................. 438/106, 438/108, 112, 113, 114, 118, 127; 257/773, 257/778, 783, 787, E21.214, E23.01, E21.502, 257/E23.116

See application file for complete search history.

(56) References Cited

U.S. PATENT DOCUMENTS

| 2005/0247665 | A1* | 11/2005 | Oi et al. | 216/13 |
| 2008/0265383 | A1* | 10/2008 | Brunnbauer et al. | 257/659 |
| 2009/0261468 | A1* | 10/2009 | Kroeninger et al. | 257/690 |
| 2010/0019370 | A1* | 1/2010 | Pressel et al. | 257/690 |

FOREIGN PATENT DOCUMENTS

| WO | WO 02/15266 A2 | 2/2002 |
| WO | WO 02/33751 A2 | 4/2002 |

* cited by examiner

*Primary Examiner* — Khiem D Nguyen
(74) *Attorney, Agent, or Firm* — Kratz, Quintos & Hanson, LLP

(57) ABSTRACT

A method of manufacturing a semiconductor device, includes temporarily fixing a semiconductor chip to a supporting member to direct a connection electrode toward the supporting member side, forming an insulating layer for preventing resin-permeation covering the semiconductor chip, on the supporting member and the semiconductor chip, forming a resin substrate sealing a periphery and a back surface side of the semiconductor chip, on the insulating layer, and removing the supporting member to expose the connection electrode of the semiconductor chip. A build-up wiring is connected directly to the connection electrode of the semiconductor chip.

11 Claims, 9 Drawing Sheets

(plan view)

(fragmental enlarged sectional view)

(plan view of semiconductor chip 200)

(plan view)

(fragmental enlarged sectional view)

SEMICONDUCTOR DEVICE AND METHOD OF MANUFACTURING THE SAME

CROSS-REFERENCE TO RELATED APPLICATIONS

This application is based upon and claims the benefit of priority of the prior Japanese Patent Application No 2009-232163, filed on Oct. 6, 2009, the entire contents of which are incorporated herein by reference.

FIELD

It is related to a semiconductor device and a method of manufacturing of the semiconductor device.

BACKGROUND

In the prior art, there is the semiconductor device having such a structure that a semiconductor chip is sealed with a resin substrate and wiring layers are connected to connection electrodes of the semiconductor chip. In such semiconductor device, the wiring layers are connected directly to the connection electrodes of the semiconductor chip, therefore the solder bumps used to flip-chip mount the semiconductor chip can be omitted and thus a thickness reduction can be achieved. Accordingly, the wiring paths in the semiconductor device can be shortened, so that the structure that is effective in improving the power supply characteristics can be provided because an inductance of the wirings can be reduced.

The technology similar to such semiconductor device is disclosed in Patent Literature 1 (WO 02/15266 A2) and Patent Literature 2 (WO 02/33751 A2).

As explained in the column of the related art described later, in the semiconductor device in the related art, the semiconductor chip is temporarily fixed onto the supporting member via the pressure-sensitive adhesive sheet to direct the connection electrodes downward, and then the periphery and back surface sides of the semiconductor chip are sealed with a resin. Then, the supporting member and the pressure-sensitive adhesive sheet are removed, and then the build-up wiring connected to the connection electrodes of the semiconductor chip is formed.

In the related art, when the semiconductor chip is sealed with the resin, such a problem arises that the resin permeates the connection electrodes of the semiconductor chip through the boundary between the semiconductor chip and the pressure-sensitive adhesive sheet and the connection electrodes are contaminated. In the case that the resin permeates the connection electrodes of the semiconductor chip, in forming the build-up wirings, the permeating resin easily constitutes the residue in the via hole. Therefore, the connection failure between the semiconductor chip and the build-up wiring is easily caused.

SUMMARY

According to one aspect discussed herein, there is provided a method of manufacturing a semiconductor device, which includes temporarily fixing a semiconductor chip to a supporting member to direct a connection electrode of the semiconductor chip toward the supporting member side, forming an insulating layer for preventing resin-permeation covering the semiconductor chip, on the supporting member and the semiconductor chip, forming a resin substrate sealing a periphery and a back surface side of the semiconductor chip, on the insulating layer, and removing the supporting member to expose the connection electrode of the semiconductor chip.

According to another aspect discussed herein, there is provided a semiconductor device, which includes a semiconductor chip including a connection electrode on a surface side, a resin-permeation preventing insulating layer covering a back surface and side surfaces of the semiconductor chip, and extended from an upper part of the side surfaces of the semiconductor chip to a periphery of the semiconductor chip, and a resin substrate formed under the resin-permeation preventing insulating layer, and sealing a periphery and a back surface side of the semiconductor chip.

DESCRIPTION OF EMBODIMENTS

An embodiment of the present invention will be explained with reference to the accompanying drawings hereinafter.

Related Art

Prior to the explanation of an embodiment, the related art (preliminary matter) will be explained hereunder. FIG. 1 and FIGS. 2A to 2C are views depicting a method of manufacturing a semiconductor device in the related art.

Figure 1:
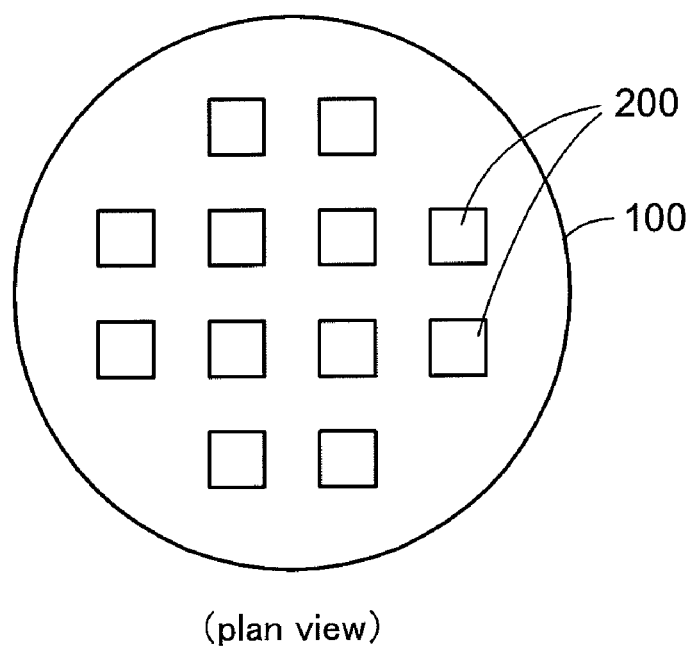
FIG. 1 is a plan view and a sectional view (#1) depicting a method of manufacturing a semiconductor device in the related art.
Figure 1:
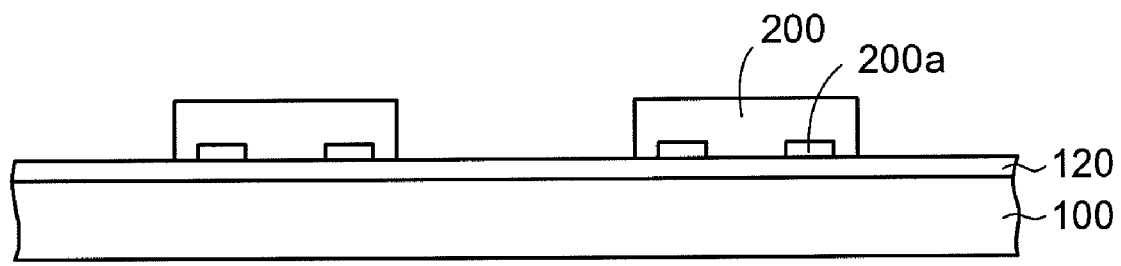

In the method of manufacturing the semiconductor device in the related art, as depicted in FIG. 1, first, a plurality of semiconductor chips 200 are arranged side by side to lateral direction on a supporting member 100 via a pressure-sensitive adhesive sheet 120 in an aligned state. The semiconductor chips 200 are temporarily fixed onto the pressure-sensitive adhesive sheet 120 on the supporting member 100 in a state that their connection electrodes 200*a* are directed downward.

In a fragmental enlarged sectional view in FIG. 1, the state of two semiconductor chips 200 in a plan view in FIG. 1 is illustrated.

Figure 2A:
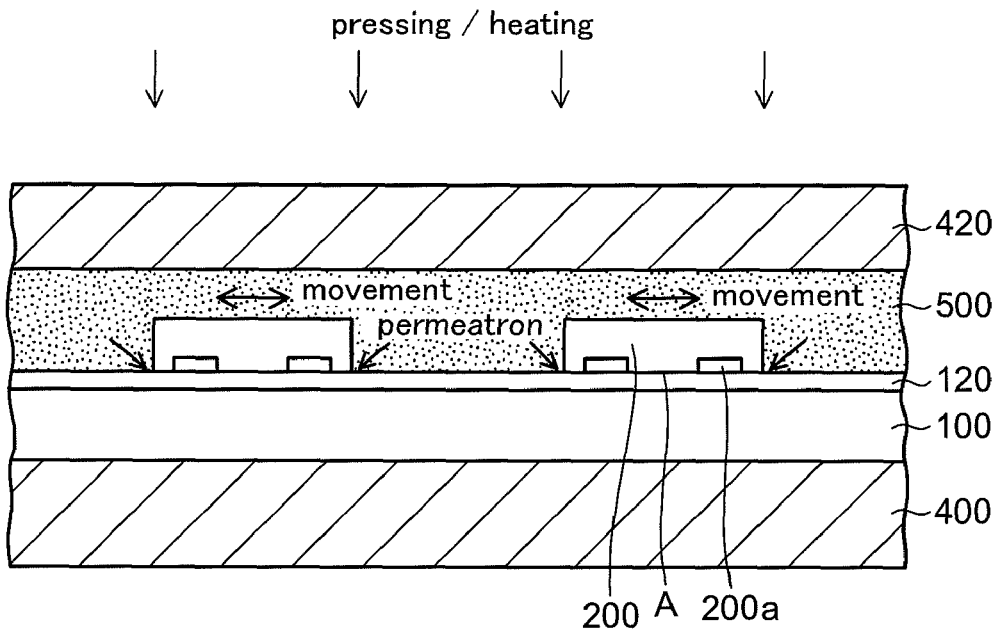
FIGS. 2A to 2C is a plan view and sectional views (#2) depicting the method of manufacturing the semiconductor device in the related art.

Then, as depicted in FIG. 2A, the supporting member 100 onto which the semiconductor chips 200 are temporarily fixed is arranged on a lower die 400. Then, a powder resin is arranged on the supporting member 100 and the semiconductor chips 200. Then, the powder resin is melted and cured by heating while pressing them downward by an upper die 420. Accordingly, periphery and back surface sides of the semiconductor chips 200 are sealed with a resin substrate 500.

Figure 2B:
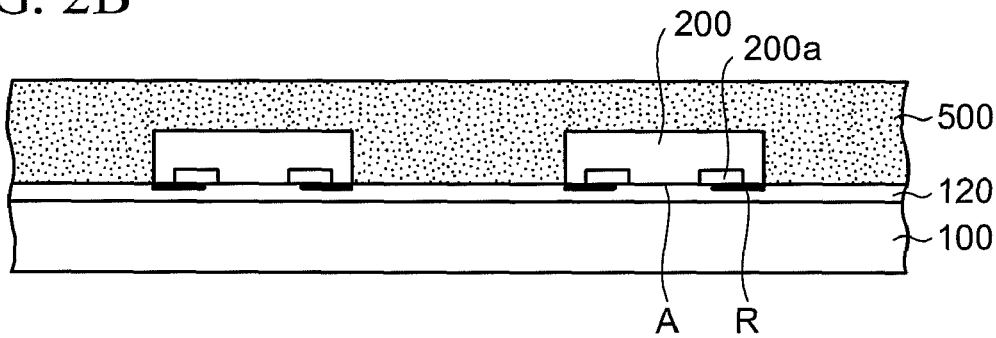

Then, as depicted in FIG. 2B, the lower die 400 and the upper die 420 are removed from the supporting member 100 and the resin substrate 500.

In the steps in FIGS. 2A and 2B, the semiconductor chips 200 are merely temporarily fixed onto the pressure-sensitive adhesive sheet 120, an element surface A on which the connection electrodes 200a of the semiconductor chip 200 are provided and the pressure-sensitive adhesive sheet 120 are not firmly adhered together. Therefore, upon melting and curing the powder resin by applying the pressure and heat, a liquid resin is ready to permeate the element surface A of the semiconductor chip 200 through the boundary between the element surface A of the semiconductor chip 200 and the pressure-sensitive adhesive sheet 120.

Accordingly, the connection electrodes 200a located on the edge side of the semiconductor chip 200 are covered and contaminated with a permeation resin R (an area indicated with a thick line in FIG. 2B). The permeation resin R is illustrated by a hatched portion of the semiconductor chip 200 in a plan view of FIG. 2C. In the case that the connection electrodes 200a of the semiconductor chip 200 are protruded upward (downward in FIGS. 2A and 2B), a clearance is ready to occur in the boundary between the element surface A of the semiconductor chip 200 and the pressure-sensitive adhesive sheet 120, therefore an amount of permeation of the permeation resin R becomes conspicuous.

Also, the adhesion between the semiconductor chips 200 and the pressure-sensitive adhesive sheet 120 is not sufficient. Therefore, in the case of melting and curing the powder resin by applying the pressure and heat, in some case, the semiconductor chip 200 is arranged to be misaligned in the lateral direction by a pushing force applied on the basis of a flow of the liquid resin.

Figure 2C:
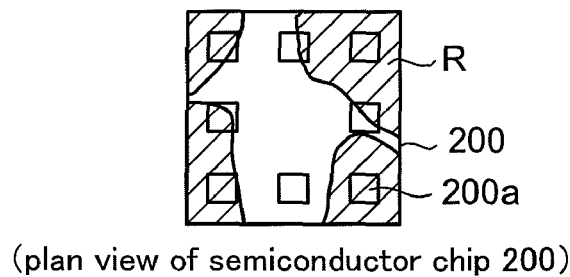
Figure 2C:
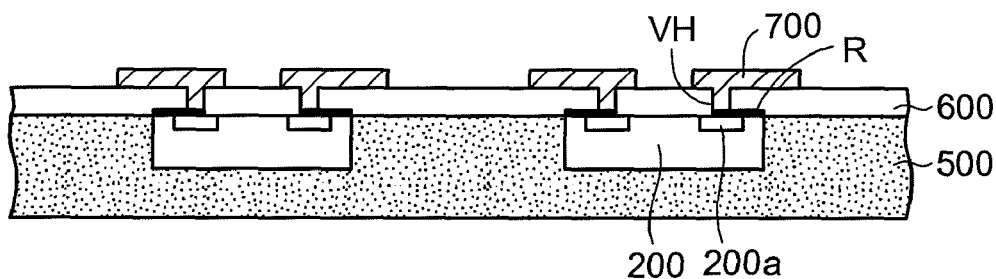

Then, as depicted in FIG. 2C, the supporting member 100 and the pressure-sensitive adhesive sheet 120 are removed from the resin substrate 500 and the semiconductor chips 200. Thus, the connection electrodes 200a of the semiconductor chip 200 are exposed.

Then, an interlayer insulating layer 600 made of resin is formed on the semiconductor chips 200 and the resin substrate 500. Then, via holes VH which reach the connection electrode 200a of the semiconductor chip 200 are formed by processing the interlayer insulating layer 600 by the laser. Then, build-up wirings 700 connected to the connection electrode 200a of the semiconductor chip 200 via the via hole VH are formed.

At this time, the permeation resin R has such a characteristic that this resin hard to be processed by the laser in contrast to the interlayer insulating layer 600, and therefore the permeation resin R is easy to remain on the bottom portion of the via hole VH as a residue. In the situation that the permeation resin R remains on the connection electrode 200a of the semiconductor chip 200, the connection failure between the semiconductor chip 200 and the build-up wiring 700 is easily caused, and such connection failure acts as the factor in yield degradation of the build-up wirings 700.

Also, when the misalignment of a plurality of semiconductor chips 200 occurs on the supporting member 100 upon forming the resin substrate 500, the via holes VH might deviate from the connection electrode 200a of the semiconductor chip 200. In some cases, the build-up wirings 700 cannot be formed with good reliability.

An embodiment explained hereunder can solve the above disadvantages.

Embodiment

FIG. 3 to FIGS. 8A and 8B are views depicting a method of manufacturing a semiconductor device according to an embodiment. The semiconductor device of the embodiment is also called a semiconductor package.

Figure 3:
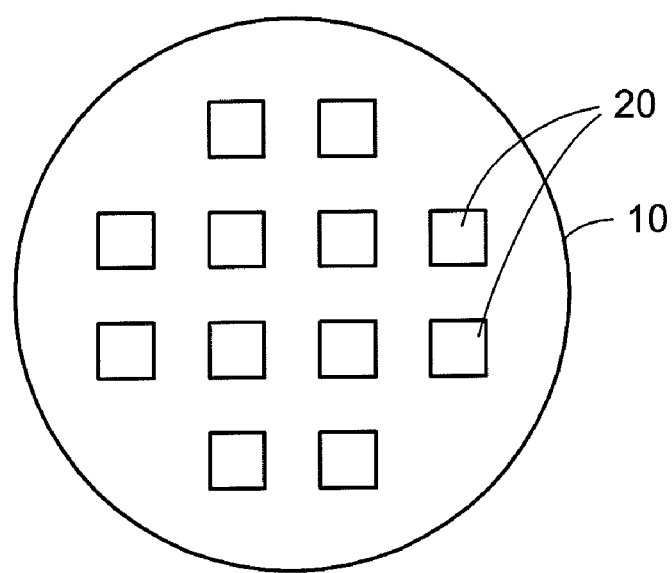
FIG. 3 is a plan view and a sectional view (#1) depicting a method of manufacturing a semiconductor device according to an embodiment.
Figure 3:
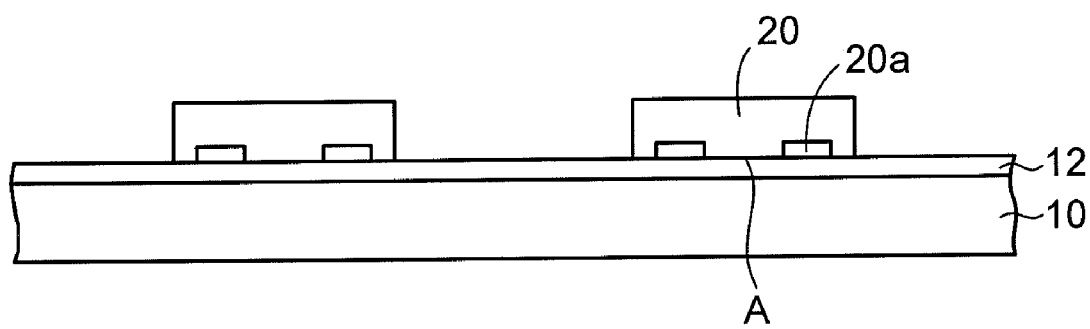

In the method of manufacturing the semiconductor device of the present embodiment, as depicted in FIG. 3, first, a pressure-sensitive adhesive sheet 12 is pasted onto supporting member 10 having a flat plate shape. Then, semiconductor chips 20 (LSI chips) in which connection electrodes 20a are provided to be exposed on the surface side are prepared.

The semiconductor chip 20 is obtained by cutting a silicon wafer (not shown) in which circuit elements such as transistors, or the like and a multilayer wiring for connecting them are provided in respective chip areas, and the connection electrodes 20a of the semiconductor chip 20 are connected to the multilayer wiring. As the semiconductor chip 20, for example, a logic LSI such as CPU, or the like is employed and its thickness is 300 to 700 μm.

Then, a plurality of semiconductor chips 20 are arranged side by side in the lateral direction on the supporting member 10 via the pressure-sensitive adhesive sheet 12. At this time, an element surface A of the semiconductor chip 20 is adhered onto the pressure-sensitive adhesive sheet 12 on the supporting member 10 and temporarily fixed thereto in a state that the element surface A, on which the connection electrodes 20a of the semiconductor chip 20 is provided, is directed toward the supporting member 10 side (lower side). In the element surface A of the semiconductor chip 20, a protection insulating layer (a passivation film, or the like) is provided in areas except the connection electrodes 20a.

Also, a plurality of semiconductor chips 20 are arranged to be aligned with chip mounting areas on the supporting member 10 respectively. In a fragmental enlarged sectional view of FIG. 3, the state of two semiconductor chips 20 in a plan view in FIG. 3 is illustrated.

In this case, the semiconductor chips 20 may be temporarily fixed (adhered) onto the supporting member 10. In place of the pressure-sensitive adhesive sheet 12, a pressure-sensitive adhesive agent may be coated thinly on the whole area of the supporting member 10 by the spin coating method, or the like. Otherwise, the pressure-sensitive adhesive agent may be coated on the element surface A of the semiconductor chip 20.

As described later, the supporting member 10 is removed after the semiconductor chips 20 are sealed with a resin substrate. Therefore, a metal plate such as a copper plate, or the like, which can be easily removed by the wet etching, is preferably employed as the supporting member 10. Any member may be employed as the supporting member 10 if such member has some level rigidity and can be removed (peeled off) later, and other members can be used in place of the metal plate.

Figure 4A:
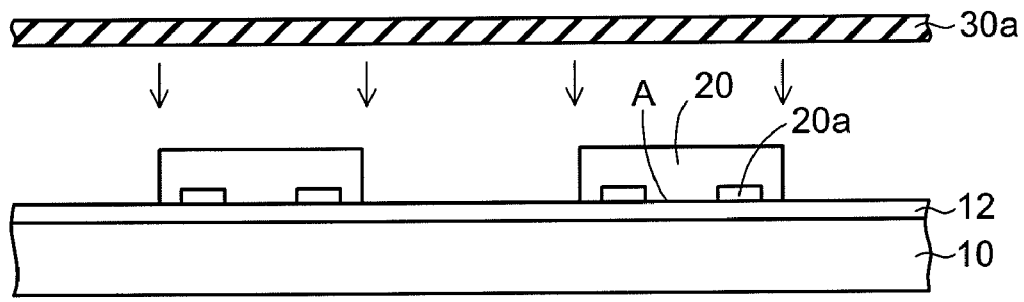
FIGS. 4A to 4C are sectional views (#2) depicting the method of manufacturing the semiconductor device according to the embodiment.

Then, as depicted in FIG. 4A, a resin sheet 30a in a semi-cured state (B stage) whose thickness is 25 to 50 μm is prepared. The resin sheet 30a is formed of a thermosetting resin such as an epoxy resin, or the like. The filler such as the silica, or the like may be contained in the resin sheet 30a, and the content percentage of the filler may be set to 30 to 50%, for example.

Figure 4B:
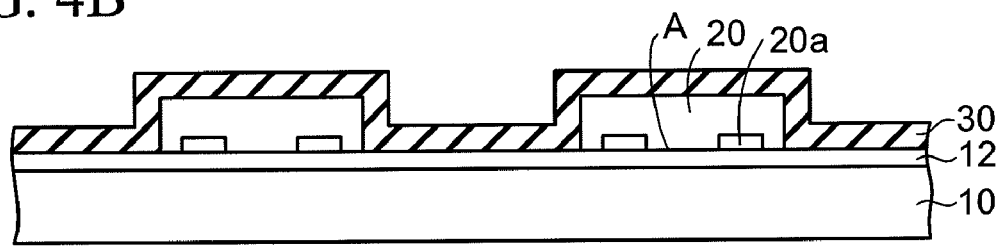

Then, as depicted in FIG. 4B, the resin sheet 30a is pasted on the supporting member 10 and the semiconductor chips 20 in a vacuum atmosphere (vacuum lamination). Then, the semi-cured resin sheet 30a is cured by applying the heating process at a temperature atmosphere of about 170° C.

Accordingly, a resin-permeation preventing insulating layer 30 is formed on the back surfaces (opposite surfaces of the element surfaces A) and four side surfaces of the square semiconductor chips 20 and the pressure-sensitive adhesive sheet 12. That is, the resin-permeation preventing insulating layer 30 is formed like a film along the upper surface of the pressure-sensitive adhesive sheet 12 and the side surfaces and the back surfaces of the semiconductor chips 20. As a result, the boundary between the element surface A of the semiconductor chip 20 and the pressure-sensitive adhesive sheet 12 is blockaded by the resin-permeation preventing insulating layer 30 and protected by it.

In this manner, the resin-permeation preventing insulating layer 30 is formed to be cured by heating the semi-cured resin sheet 30a in the vacuum atmosphere. Therefore, the semiconductor chips 20 are fixed firmly to the pressure-sensitive adhesive sheet 12 by an adhesive action of the resin-permeation preventing insulating layer 30. Also, the resin-permeation preventing insulating layer 30 is formed to adhere tightly to the semiconductor chips 20 and the pressure-sensitive adhesive sheet 12 not to generate bubbles at the boundary between the semiconductor chips 20 and the pressure-sensitive adhesive sheet 12.

Figure 4C:
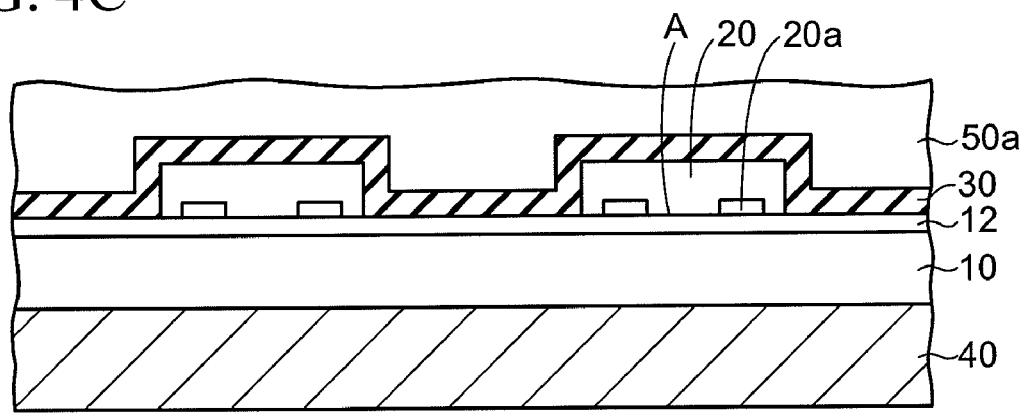

Then, as depicted in FIG. 4C, a structure in FIG. 4B is arranged on a lower die 40, and a powder resin 50a for obtaining a resin substrate is arranged on the resin-permeation preventing insulating layer 30. As the powder resin 50a, a thermosetting resin such as an epoxy resin, or the like is employed. The filler such as the silica, or the like may be contained in the powder resin 50a, and the content percentage of the filler may be set to 80 to 90%, for example.

Figure 5A:
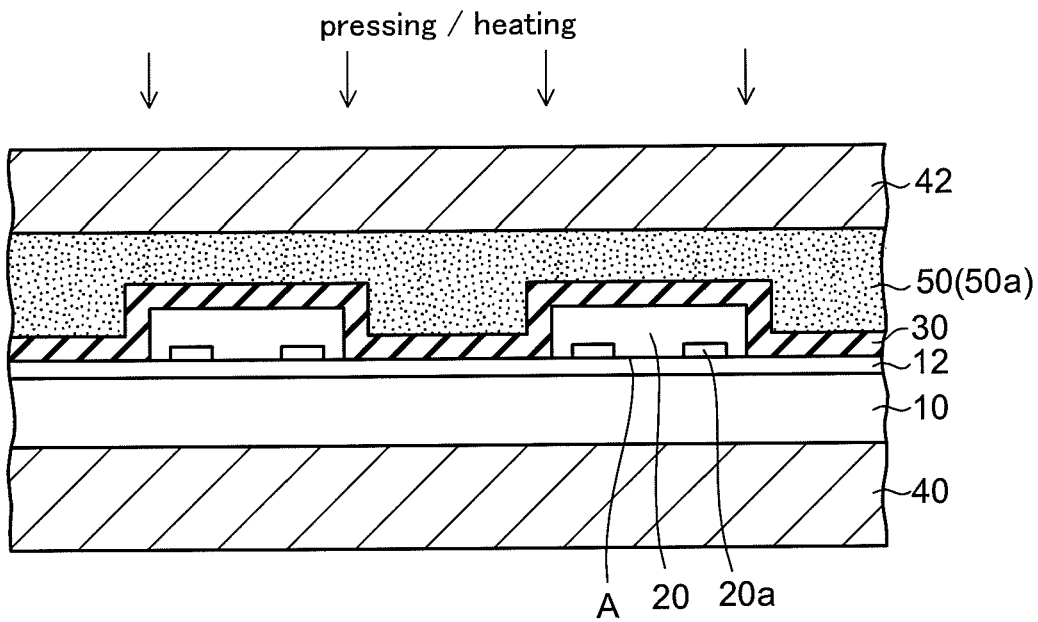
FIGS. 5A to 5C are sectional views (#3) depicting the method of manufacturing the semiconductor device according to the embodiment.

Then, as depicted in FIG. 5A, the powder resin 50a is heated at a temperature atmosphere of 150 to 170° C. while pressing downward by using an upper die 42. Accordingly, the powder resin 50a is melted and cured and simultaneously the resin is shaped by the upper die 42, so that a resin substrate 50 is formed on the peripheries and the back surface sides of the semiconductor chips 20.

In the upper surface of the resin-permeation preventing insulating layer 30 which is formed on the back surfaces of the semiconductor chips 20, the resin substrate 50 is formed to have a thickness of 100 to 300 μm. The resin substrate 50 functions as a supporting substrate which supports a plurality of semiconductor chips 20.

At this time, the semiconductor chips 20 are covered with the resin-permeation preventing insulating layer 30, and the boundaries between the element surfaces A of the semiconductor chips 20 and the pressure-sensitive adhesive sheet 12 are protected by the resin-permeation preventing insulating layer 30.

Therefore, such an event can be prevented that, when the powder resin 50a is melted/cured, a liquid resin permeates through the boundary between the element surface A of the semiconductor chip 20 and the pressure-sensitive adhesive sheet 12 and thus the connection electrodes 20a of the semiconductor chip 20 are contaminated with the permeation resin.

Also, the semiconductor chips 20 are fixed firmly to the pressure-sensitive adhesive sheet 12 by an adhesive action of the resin-permeation preventing insulating layer 30. Accordingly, even though the semiconductor chips 20 receive a pushing force in the lateral direction on the basis of a flow of the liquid resin in forming the resin substrate 50, the semiconductor chips 20 can withstand the pushing force and thus the misalignment of the semiconductor chips 20 in the lateral direction can be prevented.

In this case, the thermosetting liquid resin such as the epoxy resin, or the like may be coated instead of the powder resin 50a, and then the resin substrate 50 may be formed by applying the pressurizing and heating processes. Otherwise, the semi-cured thermosetting resin sheet made of the epoxy resin, or the like may be pasted in a vacuum atmosphere, and then the resin substrate 50 may be obtained by applying the pressurizing and heating processes.

Further, the resin substrate 50 may be formed by injecting the epoxy resin, or the like by using the transfer molding method.

In case that the resin-permeation preventing insulating layer 30 and the resin substrate 50 contain the fillers, their coefficients of thermal expansion can be approximated to that of the semiconductor chip 20. Therefore, occurrence of the thermal stress can be suppressed, and occurrence of the warping can be prevented.

Figure 5B:
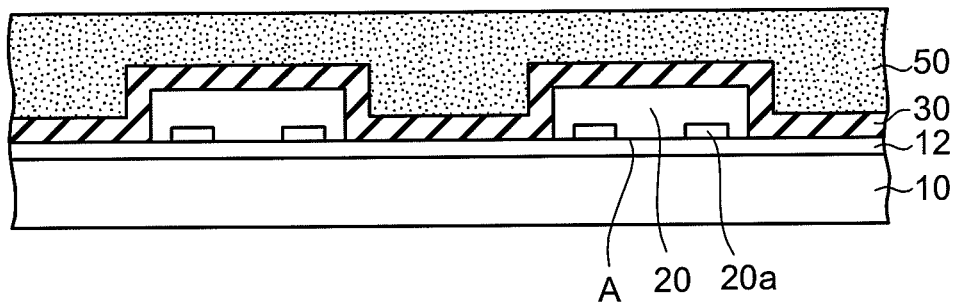

Then, as depicted in FIG. 5B, the lower die 40 and the upper die 42 are removed from the supporting member 10 and the resin substrate 50.

Figure 8A:
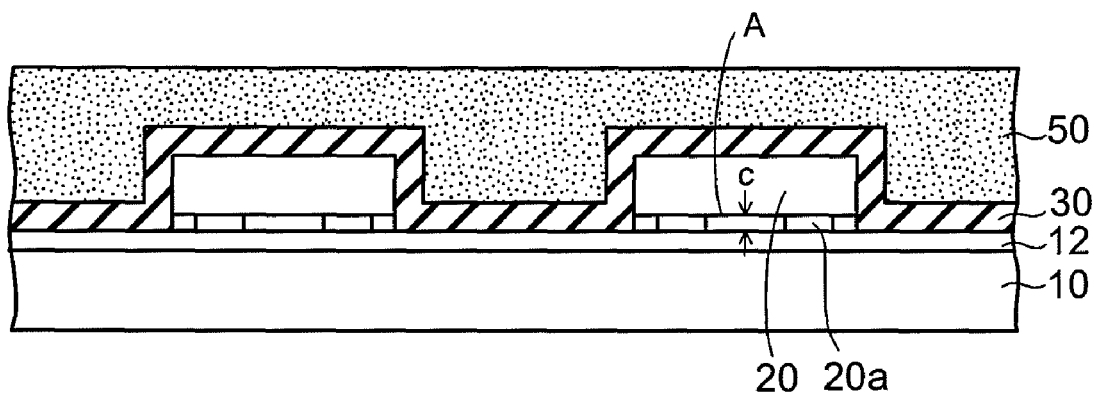
FIGS. 8A and 8B are sectional views depicting a mode in which a semiconductor chip equipped with protruding connection electrodes is employed in the method of manufacturing the semiconductor device according to the embodiment.

Here, in FIG. 8A, such a mode is depicted that the semiconductor chips 20 in which the connection electrodes 20a are protruded from the element surfaces A, are sealed with the resin by the similar method. As depicted in FIG. 8A, in the case that the connection electrodes 20a of the semiconductor chips 20 are protruded from their element surfaces A (the protection insulating layer), a clearance c is generated easily between the element surface A of the semiconductor chip 20 and the pressure-sensitive adhesive sheet 12 in the above steps in FIGS. 5A and 5B.

In the present embodiment, the boundaries between the element surfaces A of the semiconductor chips 20 and the pressure-sensitive adhesive sheet 12 are blockaded with the resin-permeation preventing insulating layer 30. Therefore, even when the clearance c is generated at the boundaries between them, the permeation of the resin can be prevented surely.

Figure 5C:
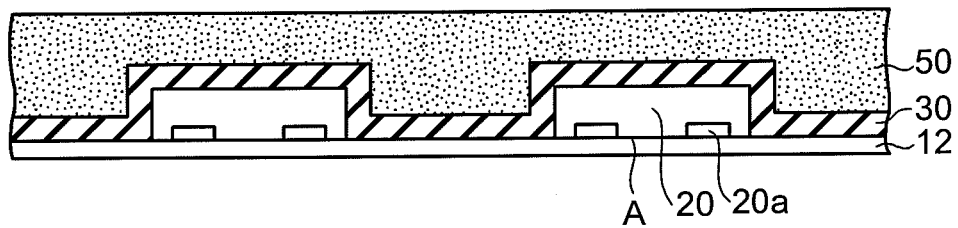

Then, the explanation will be returned to FIG. 5C, and the supporting member 10 is removed from the pressure-sensitive adhesive sheet 12. In the case that the metal plate such as the copper plate, or the like is employed as the supporting member 10, the metal plate is removed by the wet etching and the pressure-sensitive adhesive sheet 12 is exposed.

Figure 6A:
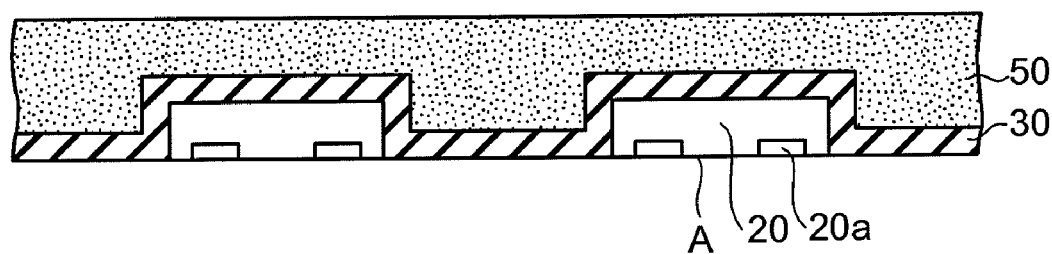
FIGS. 6A to 6C are sectional views (#4) depicting the method of manufacturing the semiconductor device according to the embodiment.

Then, as depicted in FIG. 6A, by peeling off the pressure-sensitive adhesive sheet 12 from the structure in FIG. 5C, the connection electrodes 20a of the semiconductor chips 20 and the resin-permeation preventing insulating layer 30 are exposed. As described above, in forming the resin substrate 50, the liquid resin does not permeate into the element surfaces A of the semiconductor chips 20 by the protection of the resin-permeation preventing insulating layer 30. Therefore, the connection electrodes 20a of the semiconductor chips 20 are exposed in a clean state.

Here, when the semiconductor chips 20 are temporarily fixed onto the supporting member 10 by the pressure-sensitive adhesive agent, the pressure-sensitive adhesive agent is removed by a stripper after the supporting member 10 is removed.

Alternatively, a thermally peelable adhesive agent may be used as the pressure-sensitive adhesive sheet 12. In this case, the pressure-sensitive adhesive sheet 12 and the supporting member 10 are separated simultaneously from the structure in FIG. 5B by applying the heating, and thus a structure in FIG. 6A can be obtained.

Here, unlike the present embodiment, in the case that the resin-permeation preventing insulating layer 30 is not formed, upon forming the resin substrate 50 from the powder resin 50a in the step in FIG. 5A, the bubbles are easily generated in the resin substrate of the boundary with the pressure-sensitive adhesive sheet 12.

Therefore, when the resin substrate 50 is exposed by removing the supporting member 10 and the pressure-sensitive adhesive sheet 12, the bubbles in the resin substrate 50 cause a level difference on the surface. As a result, a reduction of yield of the formation of the build-up wiring explained hereunder is caused by the influence of the level difference on the surface of the resin substrate 50.

However, in the present embodiment, as described above, the resin-permeation preventing insulating layer 30 is formed to be adhered tightly onto the pressure-sensitive adhesive sheet 12 not to generate the bubbles. Therefore, when the supporting member 10 and the pressure-sensitive adhesive sheet 12 are removed, the exposed surface of the resin-permeation preventing insulating layer 30 constitutes a flat surface.

Accordingly, the build-up wiring explained hereunder can be formed with good reliability.

Figure 6B:
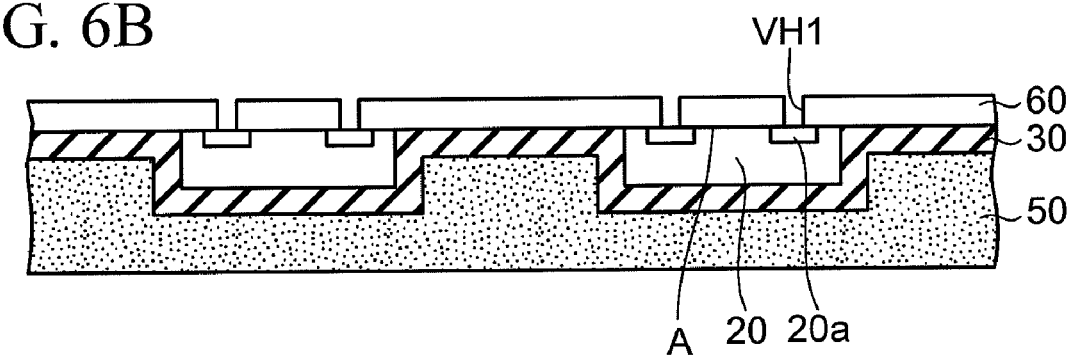

Then, as depicted in FIG. 6B, the structure in FIG. 6A is reversed up and down. Then, a resin film made of epoxy, polyimide, or the like is pasted on the element surfaces A (front surfaces) of the semiconductor chips 20 and the resin-permeation preventing insulating layer 30, or the like, and thus a first interlayer insulating layer 60 is formed. Then, the first interlayer insulating layer 60 is processed by the laser, and thus first via holes VH1 whose depth reaches the connection electrode 20a of the semiconductor chip 20 respectively are formed.

At this time, the permeation resin which is hard to be processed by the laser does not exist on the connection electrodes 20a of the semiconductor chips 20. Therefore, the connection electrode 20a of the semiconductor chip 20 can be exposed in the first via holes VH1 with good reliability.

Also, the semiconductor chips 20 are arranged at desired positions on the resin substrate 50 not to misalign. Therefore, the first via holes VH1 are arranged on respective connection electrodes 20a of a plurality of semiconductor chips 20 with good reliability.

In this case, the first interlayer insulating layer 60 may be formed from a photosensitive resin such as epoxy, polyimide, or the like, and then the first via holes VH1 may be formed by exposure and developing the photosensitive resin.

Figure 6C:
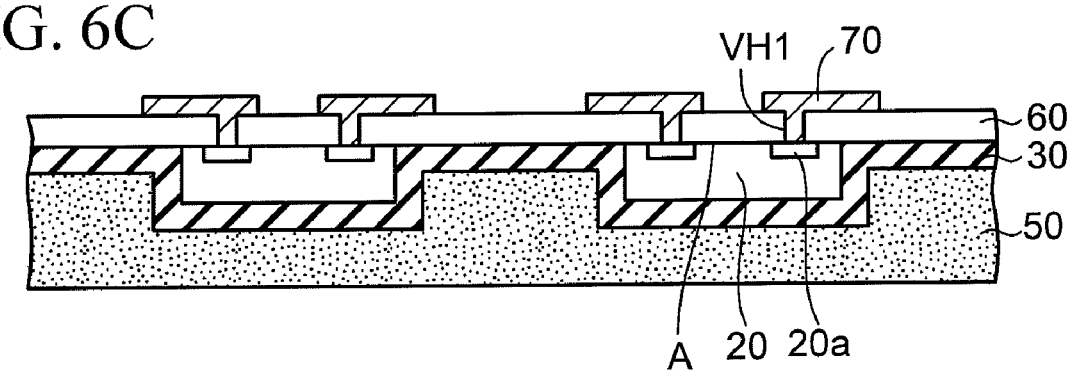

Then, as depicted in FIG. 6C, first wiring layers 70 which are connected to the connection electrode 20a of the semiconductor chip 20 via the first via hole VH1 (via conductor) are formed on the first interlayer insulating layer 60. Since the connection electrodes 20a of the semiconductor chips 20 are exposed in the first via hole VH1, the first wiring layers 70 are connected electrically to the connection electrodes 20a of the semiconductor chips 20 with good reliability.

The first wiring layers 70 can be formed by various wiring forming methods. The method of forming the first wiring layers 70 by the semi-additive process will be explained by way of example hereunder. First, a seed layer (not shown) made of copper, or the like is formed in the first via holes VH1 and on the first interlayer insulating layer 60 by the sputter method or the electroless plating. Then, a plating resist (not shown) in which opening portions are provided in portions where the first wiring layers 70 are arranged is formed.

Then, a metal plating layer (not shown) made of copper, or the like is formed in the first via holes VH1 and the opening portions of the plating resist by the electroplating utilizing the seed layer as a plating power feeding path. Then, the plating resist is removed, and then the first wiring layers 70 are obtained by etching the seed layer while using the metal plating layer as a mask.

In the present embodiment, the semiconductor chips 20 are not connected to the wiring substrate by the flip-chip mounting, but the first wiring layers 70 are connected directly to the connection electrodes 20a of the semiconductor chips 20. Therefore, there is no need to employ the bump electrode for flip-chip mounting, made of the solder bumps, or the like, whose height is high (e.g., 50 to 100 µm). As a result, a reduction in thickness of the semiconductor device can be achieved.

Figure 7A:
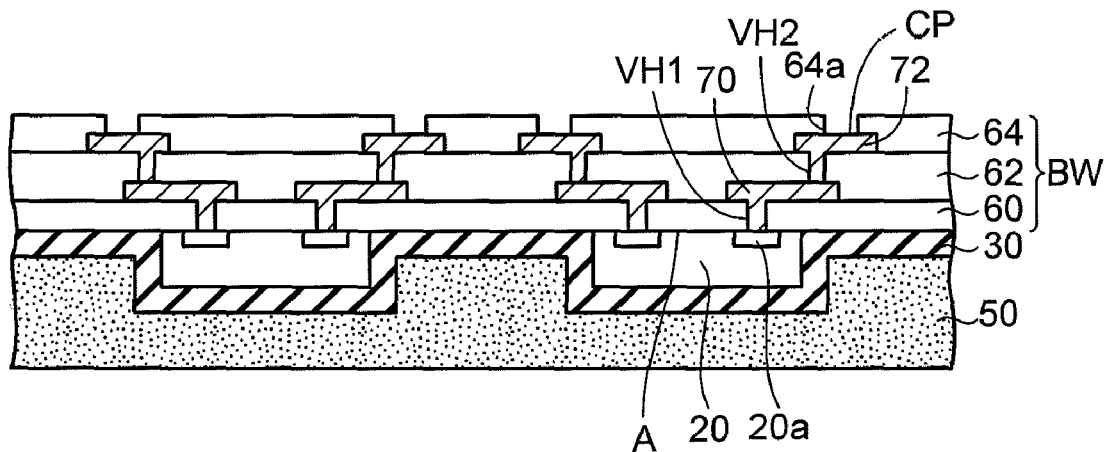
FIGS. 7A and 7B are sectional views (#5) depicting the method of manufacturing the semiconductor device according to the embodiment.

Then, as depicted in FIG. 7A, a second interlayer insulating layer 62 for covering the first wiring layers 70 is formed by the similar method, and then second via holes VH2 each reaching the first wiring layer 70 are formed in the second interlayer insulating layer 62. Then, second wiring layers 72 each connected to the first wiring layer 70 via the second via hole VH2 (via conductor) are formed on the second interlayer insulating layer 62 by the similar method.

After this, a solder resist 64 in which opening portions 64a are provided on connection portions CP of the second wiring layers 72 is formed. Then, as the need arises, a contact layer (not shown) is formed by forming nickel/gold plating layers on the connection portions CP of the second wiring layers 72 in sequence from the bottom, or the like.

Additionally, an external connection terminal such as a solder ball, a lead pin, or the like may be provided on the connection portions CP of the second wiring layers 72. Also, the connection portions CP of the second wiring layers 72 in themselves may be used as the external connection terminals.

Accordingly, a two-layered build-up wiring BW connected to the connection electrodes 20a of the semiconductor chips 20 is formed on the semiconductor chips 20 and the resin substrate 50 (the resin-permeation preventing insulating layer 30). The two-layered build-up wiring BW is illustrated, but n-layered (n is an integer in excess of 1) wiring layer may be arbitrarily formed. A pitch of the connection electrodes 20a of the semiconductor chips 20 is converted into a desired wider pitch by the first and second wiring layers 70, 72.

Figure 7B:
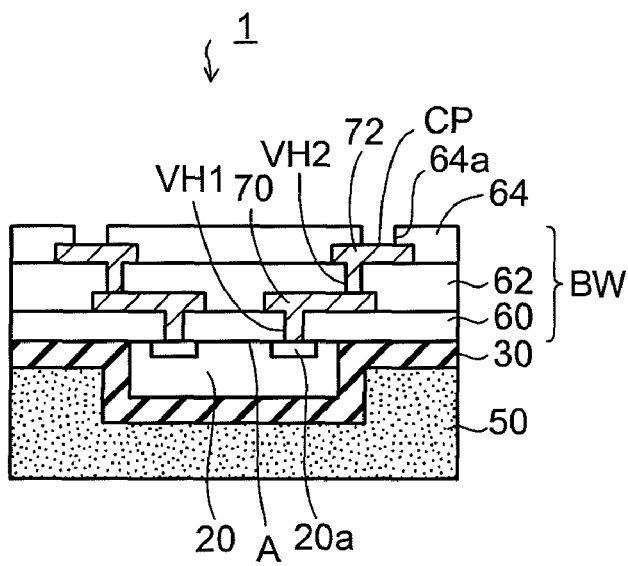

Also, respective portions from the build-up wiring BW to the resin substrate 50 on the boundaries (intermediate portions) of respective semiconductor chips 20 are cut. Thus, as depicted in FIG. 7B, individual semiconductor devices 1 are obtained.

Here, when the heat radiation characteristics of the semiconductor device 1 should be improved, the resin substrate 50 and the resin-permeation preventing insulating layer 30 may be polished from the lower surface side of the resin substrate 50 after the step in FIG. 7A, and thus the back surfaces of the semiconductor chips 20 may be exposed. Then, similarly the boundary parts of respective semiconductor chips 20 are cut, and individual semiconductor devices are obtained.

As explained above, in the method of manufacturing the semiconductor device of the present embodiment, a plurality of semiconductor chips 20 are temporarily fixed onto the supporting member 10 via the pressure-sensitive adhesive sheet 12, and then the boundaries between the element surfaces A of the semiconductor chips 20 and the pressure-sensitive adhesive sheet 12 are blockaded and protected by coating the semiconductor chips 20 with the resin-permeation preventing insulating layer 30.

Then, the powder resin 50a is melted and cured by applying the pressurizing and heating processes. Thus, the periphery and back surface sides of the semiconductor chip 20 are sealed with the resin substrate 50.

At this time, the boundary between the element surface A of the semiconductor chip 20 and the pressure-sensitive adhesive sheet 12 is protected by the resin-permeation preventing insulating layer 30. Therefore, there is no possibility that the liquid resin permeates through the boundary between them. Also, the semiconductor chip 20 is fixed firmly to the pressure-sensitive adhesive sheet 12 by the resin-permeation preventing insulating layer 30. Therefore, there is no possibility that the misalignment of the semiconductor chip 20 is caused by a flow of the liquid resin.

After this, the connection electrodes 20a of the semiconductor chip 20 are exposed by removing the supporting member 10 and the pressure-sensitive adhesive sheet 12.

In this manner, in the semiconductor chip 20 on the supporting member 10, the contamination of the connection electrodes 20a and the misalignment which are caused by the permeation resin can be avoided. Therefore, the build-up wiring BW which is connected to the connection electrodes 20a of the semiconductor chips 20 can be formed with good field.

As depicted in FIG. 7B, in the semiconductor device 1 of the present embodiment, the back surface and side surfaces of the semiconductor chip 20 including the connection electrodes 20a on the element surface A of the front surface side are covered with the resin-permeation preventing insulating layer 30, and the resin-permeation preventing insulating layer 30 is formed to extend from the upper part of the side surface of the semiconductor chip 20 to the periphery. Also, the resin substrate 50 for sealing the periphery and back surface sides of the semiconductor chip 20 is formed under the resin-permeation preventing insulating layer 30.

In this way, the periphery and back surface sides of the semiconductor chip 20 are sealed with the resin-permeation preventing insulating layer 30 and the resin substrate 50. The resin substrate 50 functions as the supporting substrate which supports the semiconductor chip 20.

In FIG. 7B, the element surface A of the semiconductor chip 20 and the upper surface of the resin-permeation preventing insulating layer 30 are arranged at the equal height to constitute the identical surface. As explained in the foregoing manufacturing method, the resin-permeation preventing insulating layer 30 functions as the protection layer to prevent such an event that, when the resin substrate 50 is formed, the liquid resin permeates into the element surface A of the semiconductor chip 20. Therefore, in the semiconductor device 1 in the present embodiment, the permeation resin does not exist on the element surface A of the semiconductor chip 20, and the element surface A is kept in a clean state.

The first interlayer insulating layer 60 in which the first via hole VH1 is provided on the connection electrodes 20a of the semiconductor chip 20 respectively is formed on the semiconductor chip 20 and the resin-permeation preventing insulating layer 30. The first wiring layers 70 each connected to the connection electrode 20a of the semiconductor chip 20 via the first via hole VH1 (via conductor) are formed on the first interlayer insulating layer 60.

The second interlayer insulating layer 62 in which the second via hole VH2 is formed on the connection part of the first wiring layers 70 respectively is formed on the first wiring layers 70 and the first interlayer insulating layer 60.

The second wiring layers 72 each connected to the first wiring layer 70 via the second via hole VH2 (via conductor) are formed on the second interlayer insulating layer 62. Also, the solder resist 64 in which the opening portion 64a is provided on the connection part of the second wiring layers 72 respectively is formed. The contact layer may be provided in the connection part of the second wiring layers 72 respectively by the nickel/gold plating layers in sequence from the bottom, or the like.

In this manner, the two-layered build-up wiring BW connected to the connection electrodes 20a of the semiconductor chips 20 is formed on the semiconductor chips 20 and the resin-permeation preventing insulating layer 30. The two-layered build-up wiring BW is illustrated, but the n-layered (n is an integer in excess of 1) wiring layer may be arbitrarily formed.

In the semiconductor device 1 in the present embodiment, as described above, upon sealing the semiconductor chips 20 arranged on the supporting member 10 with the resin substrate 50, the semiconductor chips 20 are protected to be coated with the resin-permeation preventing insulating layer 30. Therefore, the permeation of the liquid resin onto the element surfaces A of the semiconductor chips 20 can be prevented.

Accordingly, the connection electrodes 20a of the semiconductor chip 20 can be kept in a clean state. As a result, the build-up wiring BW connected to the connection electrodes 20a of the semiconductor chips 20 can be formed with good yield.

Also, the misalignment of the semiconductor chips 20 on the supporting member 10 can be prevented by an adhesive action of the resin-permeation preventing insulating layer 30, and thus the build-up wiring BW can be formed with good yield.

Figure 8B:
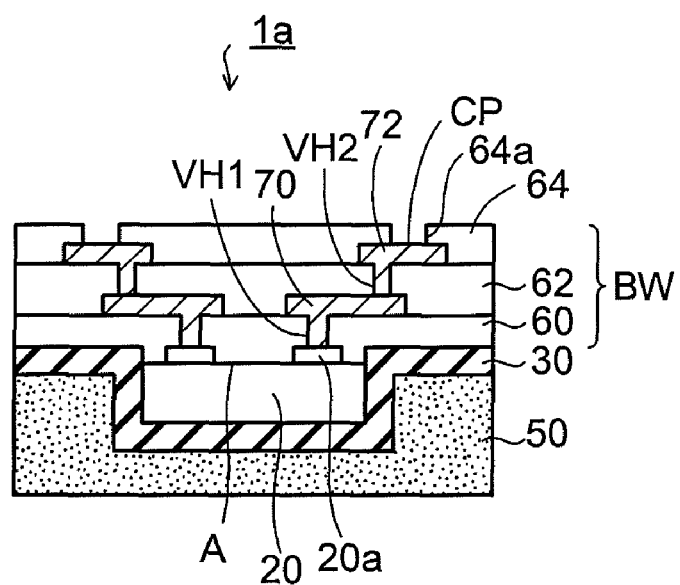

In FIG. 8B, in the above described manufacturing method, a semiconductor device 1a when the semiconductor chip 20 whose connection electrodes 20a are protruded from the element surface A is employed is depicted. In the semiconductor device 1a in this mode, the clearance c is generated between the element surface A of the semiconductor chip 20 and the pressure-sensitive adhesive sheet 12 (FIG. 8A) in the above manufacturing method.

As a result, the upper surface of the resin-permeation preventing insulating layer 30 is arranged on the upper side than the element surface A (protection insulating layer) of the semiconductor chip 20, and is arranged at the equal height with upper surfaces of the connection electrodes 20a of the semiconductor chip 20. Then, the level difference of the connection electrodes 20a of the semiconductor chip 20 is buried by the first interlayer insulating layer 60. Other elements are similar to those of the semiconductor device 1 in FIG. 7B. The semiconductor device 1a in FIG. 8B can achieve the similar advantages of the semiconductor device 1 in FIG. 7B.

Figure 9:
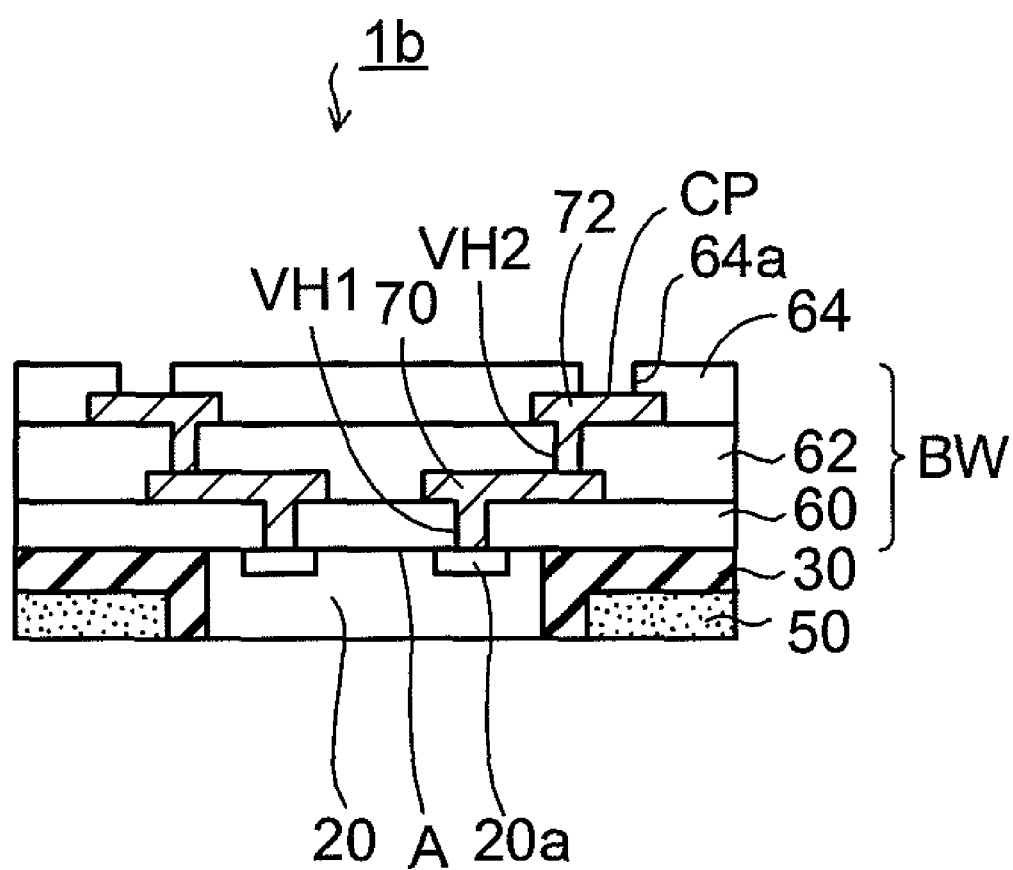
FIG. 9 is another semiconductor device according to the embodiment.

As described above, when the heat radiation characteristics of the semiconductor device should be improved, the resin substrate 50 and the resin-permeation preventing insulating layer 30 are polished from the lower surface side of the resin substrate 50 after the step in FIG. 7A. In this case, as depicted in semiconductor device 1b of FIG. 9, the back surfaces of the semiconductor chips 20 is exposed from the resin substrate 50 and the resin-permeation preventing insulating layer 30. Thus the periphery of the semiconductor chips 20 is sealed by the resin-permeation preventing insulating layer 30 and the resin substrate 50.

All examples and conditional language recited herein are intended for pedagogical purpose to aid the reader in understanding the invention and the concepts contributed by the inventor to furthering the art, and are to be construed as being without limitation to such specifically recited examples and conditions, nor does the organization of such examples in the specification relate to a showing of the superiority and interiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, comprising:
   temporarily fixing a semiconductor chip to a supporting member to direct a connection electrode of the semiconductor chip toward the supporting member side;
   forming an insulating layer for preventing resin-permeation covering the semiconductor chip, on the supporting member and the semiconductor chip;
   forming a resin substrate sealing a periphery and a back surface side of the semiconductor chip, on the insulating layer, wherein the resin substrate contacts the insulating layer to prevent resin-permeation;
   removing the supporting member to expose the connection electrode of the semiconductor chip;
   forming an interlayer insulation layer on the semiconductor chip and the insulating layer to prevent resin-permeation;
   forming, in the interlayer insulation layer, a via hole reaching the connection electrode of the semiconductor chip, wherein a surface of the interlayer insulation layer except the via hole is flat; and
   polishing the resin substrate and the insulating layer to prevent resin-permeation;
   wherein a back surface of the semiconductor chip and a part of the insulating layer for preventing resin-permeation covering a side surface of the semiconductor chip are exposed.

2. A method of manufacturing a semiconductor device according to claim 1, after removing the supporting member, further comprising:
   forming a wiring layer connected directly to the connection electrode of the semiconductor chip, on a surface of the semiconductor chip and the insulating layer.

3. A method of manufacturing a semiconductor device according to claim 1, wherein, in the temporarily fixing the semiconductor chip onto the supporting member, the semiconductor chip is temporarily fixed onto the supporting member via an adhesive sheet, and after the supporting member is removed, the adhesive sheet is peeled off.

4. A method of manufacturing a semiconductor device according to claim 1, wherein, in the temporarily fixing the semiconductor chip onto the supporting member, a plurality of semiconductor chips are arranged on the supporting member, and after forming the wiring layer, further comprising:
   obtaining individual semiconductor devices by cutting boundary parts of the plurality of semiconductor chips.

5. A method of manufacturing a semiconductor device according to claim 1, wherein the forming the insulating layer includes pasting a semi-cured thermosetting resin sheet on the supporting member and the semiconductor chip in a vacuum atmosphere, and curing the semi-cured thermosetting resin sheet by applying a heating process.

6. A method of manufacturing a semiconductor device according to claim 1, wherein the forming the resin substrate includes forming a thermosetting powder resin or a thermosetting liquid resin on the insulating layer, and curing the powder resin or the liquid resin by pressurizing and heating processes.

7. A method of manufacturing a semiconductor device according to claim 1, wherein the supporting member is formed of a metal plate, and in the removing the supporting member, the metal plate is removed by a wet etching.

8. A method of manufacturing a semiconductor device according to claim 1,
   wherein the step of polishing the resin substrate and the insulating layer takes place after removing the supporting member, and
   wherein polishing the resin substrate and the insulating layer exposes the back surface of the semiconductor chip.

9. A method of manufacturing a semiconductor device according to claim 1, wherein, in the step of forming a via hole, the via hole is formed only on the connection electrode of the semiconductor chip.

10. A method of manufacturing a semiconductor device according to claim 1, further comprising:
    after the step of forming the via hole, and before the step of polishing the resin substrate and the insulating layer,
    forming multilayer wirings, having two or more layers on the interlayer insulation layer, and being connected to the connection electrode of the semiconductor chip through the via hole.

11. A method of manufacturing a semiconductor device according to claim 1, wherein:
    in the step of temporarily fixing the semiconductor chip, the connection electrode is protruded from element surfaces of the semiconductor chip; and
    in the step of forming an interlayer insulation layer, a level difference of the connection electrode of the semiconductor chip is buried by the interlayer insulation layer, and a surface of the interlayer insulation layer is formed flat.

* * * * *